(12) United States Patent
Yagishita et al.

(10) Patent No.: US 6,529,435 B2
(45) Date of Patent: Mar. 4, 2003

(54) SEMICONDUCTOR MEMORY DEVICE

(75) Inventors: Yoshimasa Yagishita, Kawasaki (JP); Toshiya Uchida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/000,313

(22) Filed: Dec. 4, 2001

(65) Prior Publication Data

US 2002/0141270 A1 Oct. 3, 2002

(30) Foreign Application Priority Data

Mar. 29, 2001 (JP) .................................... 2001-096343

(51) Int. Cl.[7] ................................................ G11C 7/00
(52) U.S. Cl. ............ 365/222; 365/230.03; 365/189.01; 365/230.09
(58) Field of Search ................. 365/222, 230.03, 365/230.04, 189.01, 189.04

(56) References Cited

U.S. PATENT DOCUMENTS 5,550,781 A * 8/1996 Sugawara et al. .......... 365/222
5,822,264 A * 10/1998 Tomishima et al. ..... 365/189.09
6,233,181 B1 * 5/2001 Hidaka ...................... 365/190

FOREIGN PATENT DOCUMENTS

JP         2000-368423         4/2000

* cited by examiner

*Primary Examiner*—Michael S. Lebentritt
*Assistant Examiner*—Toan Le
(74) *Attorney, Agent, or Firm*—Arent Fox Kintner Plotkin & Kahn, PLLC

(57) ABSTRACT

A semiconductor memory device which permits access even during refresh operation and also is low in power consumption. An address input circuit receives an input address, and a readout circuit reads out data from at least part of a subblock group arranged in a column or row direction and specified by the address input via the address input circuit. A refresh circuit refreshes at least part of a subblock group arranged in a row or column direction and intersecting with the subblock group from which data is read out by the readout circuit. A data restoration circuit restores data of a subblock where refresh operation and readout operation take place concurrently, with reference to data from the other subblocks and a parity block.

8 Claims, 25 Drawing Sheets

|  | MEMORY ARRAY | | | | | | | PARITY ARRAY | |
|---|---|---|---|---|---|---|---|---|---|
| DQ0 | | DQ1 | | DQ2 | | DQ3 | | | |
| 0 | 8 | 16 | 24 | 32 | 40 | 48 | 56 | 64 | 72 |
| 1 | 9 | 17 | 25 | 33 | 41 | 49 | 57 | 65 | 73 |
| 2 | 10 | 18 | 26 | 34 | 42 | 50 | 58 | 66 | 74 |
| 3 | 11 | 19 | 27 | 35 | 43 | 51 | 59 | 67 | 75 |
| 4 | 12 | 20 | 28 | 36 | 44 | 52 | 60 | 68 | 76 |
| 5 | 13 | 21 | 29 | 37 | 45 | 53 | 61 | 69 | 77 |
| 6 | 14 | 22 | 30 | 38 | 46 | 54 | 62 | 70 | 78 |
| 7 | 15 | 23 | 31 | 39 | 47 | 55 | 63 | 71 | 79 |

FIG. 17

MEMORY ARRAY   PARITY ARRAY

| 1-1 | 1-2 | 1-3 | 1-4 | 1P |
| --- | --- | --- | --- | --- |
| 2-1 | 2-2 | 2-3 | 2-4 | 2P |
| 3-1 | 3-2 | 3-3 | 3-4 | 3P |
| 4-1 | 4-2 | 4-3 | 4-4 | 4P |

FIG. 22

PRIOR ART

SEMICONDUCTOR MEMORY DEVICE

BACKGROUND OF THE INVENTION (1) Field of the Invention

The present invention relates to a semiconductor memory device, and more particularly, to a semiconductor memory device in which subblocks each constituted by one or two or more memory cells are arranged in matrix form.

(2) Description of the Related Art

In the so-called DRAM (Dynamic Random Access Memory), it is necessary to refresh the memory cells, and Ski conventionally, therefore, access from outside is temporarily halted to carry out refreshing.

If access from outside is temporarily halted, however, the time required to respond to the external access is correspondingly prolonged, which is inconvenient for applications requiring high-speed access.

The applicant hereof previously filed a patent application (Japanese Patent Application No. 2000-368423) relating to a, semiconductor memory device (hereinafter referred to as the semiconductor memory device of the prior application) which permits external access even during refreshing.

FIG. 22 illustrates the principle of operation of the semiconductor memory device of the prior application. As shown in the figure, the semiconductor memory device of the prior application comprises a memory array constituted by 16 subblocks, and a parity array constituted by four subblocks.

Each subblock comprises a cell array having memory cells arranged in matrix form, S/A's (Sense Amplifiers), and decoders.

The subblocks constituting the memory array store ordinary data, while the subblocks constituting the parity array store parity data.

FIG. 23 illustrates the operation for reading out data from the memory array. As shown in the figure, when data is read out, a series of subblocks (shaded subblocks) along a row is selected to read out data D1 to D4.

FIG. 24 illustrates a refresh operation. In the semiconductor memory device of the prior application, the subblocks are refreshed one by one in sequence. In the illustrated example, the subblock 2-3 indicated by hatching is the target of refreshing. To explain the operation in more detail, a row of subblocks is refreshed from left to right, for example, and when all subblocks included in one row have been refreshed, the next row is refreshed.

FIG. 25 illustrates an operation performed when a subblock to be refreshed overlaps with the subblocks from which data is read out in the case where refresh operation and data read operation are carried out in parallel with each other.

In the illustrated example, the subblocks 2-1 to 2-4 in the memory array are the target of data read, and the subblock 2-3 is the target of refreshing.

In this case, data cannot be read from the subblock 2-3, and therefore, the semiconductor memory device of the prior application is configured such that data output from the subblocks 2-1, 2-2 and 2-4 and parity data read from the subblock 2P are supplied to a data restoration circuit 200 to restore data of the subblock 2-3 based on these items of data.

With this method, however, since the subblocks are refreshed one by one, a problem arises in that the amount of power consumption is large, compared with the case where the entire memory array is collectively refreshed, for example.

SUMMARY OF THE INVENTION

The present invention was created in view of the above circumstances, and an object thereof is to provide a semiconductor memory device which permits access even during refresh operation and also is low in power consumption.

To achieve the object, there is provided a semiconductor memory device in which subblocks each constituted by one or two or more memory cells are arranged in matrix form. The semiconductor memory device comprises an address input circuit for receiving an input address, a readout circuit for reading out data from at least part of a subblock group arranged in a column or row direction and specified by the address input via the address input circuit, and a refresh circuit for refreshing at least part of a subblock group arranged in a row or column direction and intersecting with the subblock group from which data is read out by the readout circuit.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIG. 17 is a diagram showing in detail an exemplary arrangement of subblocks wherein S/A's and decoders are both single-access type;

FIG. 22 is a diagram illustrating the principle of operation of a semiconductor memory device of a prior application;

DESCRIPTION OF THE PREFERRED EMBODIMENTS

Embodiments of the present invention will be hereinafter described with reference to the drawings.

Figure 1:
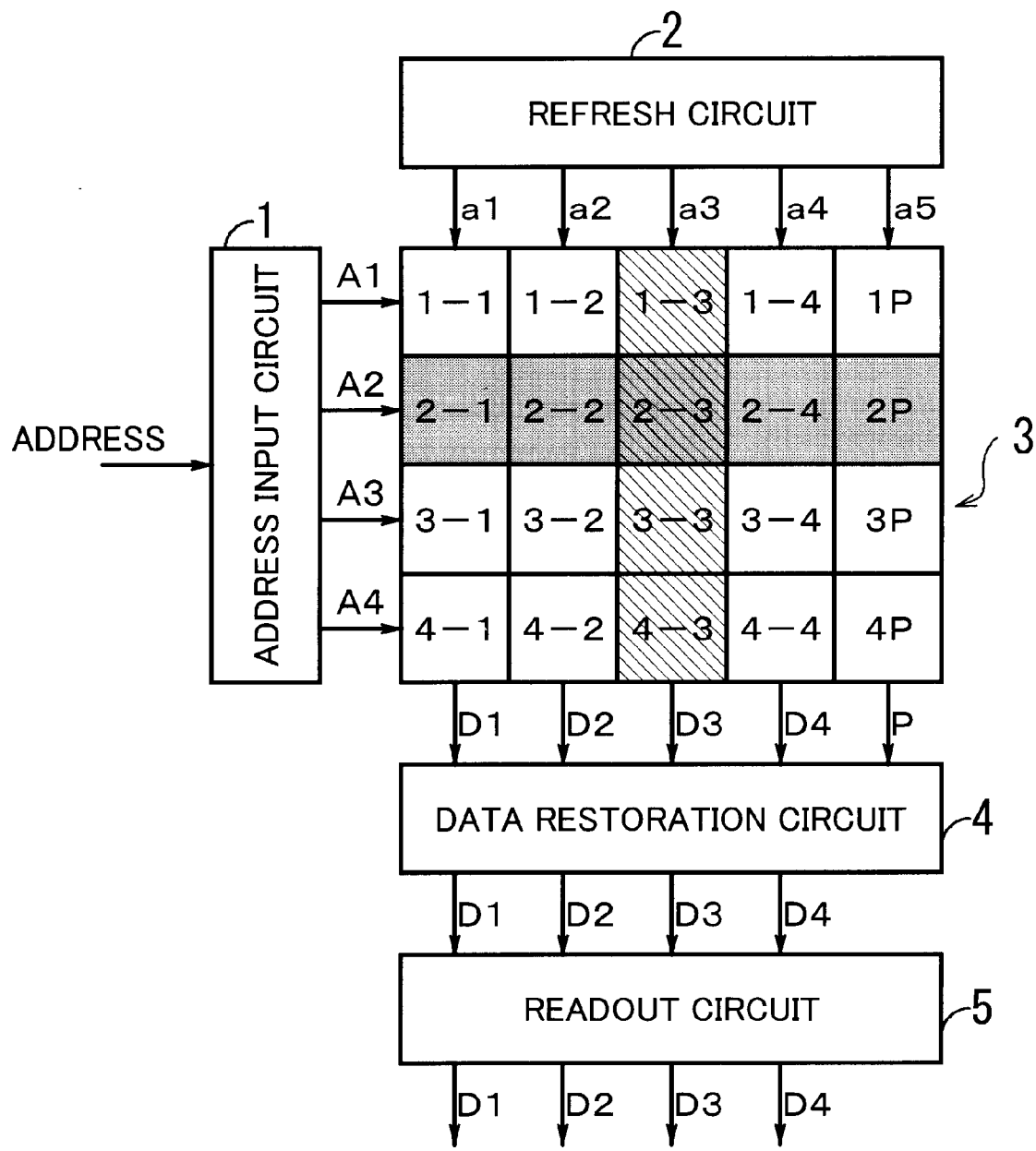
FIG. 1 is a diagram showing an exemplary configuration according to an embodiment of the present invention.

FIG. 1 illustrates an exemplary configuration according to an embodiment of the present invention. As shown in the figure, a semiconductor memory device of the present invention comprises an address input circuit 1, a refresh circuit 2, a subblock arrangement 3, a data restoration circuit 4, and a readout circuit 5.

The address input circuit 1 receives an address which is input thereto from outside the semiconductor memory device.

The refresh circuit 2 generates an address specifying a group of subblocks to be refreshed, and refreshes the subblocks specified by the address.

The subblock arrangement 3 comprises a plurality of subblocks each constituted by S/A's, a decoder and a cell array.

The subblocks 1-1 to 4-1, 1-2 to 4-2, 1-3 to 4-3 and 1-4 to 4-4 constitute a memory array and store ordinary data. The subblocks 1P to 4P constitute a parity array and store parity data.

The data restoration circuit 4 restores data of a subblock that cannot be read out because of refreshing, by using the parity data and the data read from the other subblocks.

The readout circuit 5 requests the data restoration circuit 4 to read out data specified by the address input via the address input circuit 1, and outputs data obtained as a result of the request to outside.

Operation of the above embodiment will be now described.

The refresh circuit 2 sequentially generates addresses a1 to a5 to specify a column in the subblock arrangement 3 and refreshes the subblocks included in the specified column. As a result, refreshing is sequentially performed in the order of subblocks 1-1 to 4-1, subblocks 12 to 4-2, subblocks 1-3 to 4-3, . . . , for example.

The addresses a1 to a5 generated by the refresh circuit 2 are independent of those input via the address input circuit 1, and therefore, a column of subblocks can be specified independently of the addresses A1 to A4.

The address input circuit 1 generates, based on the address input thereto, the address A1, A2, A3 or A4 specifying a row of subblocks, and supplies the generated address to the specified row of the subblock arrangement 3.

The data restoration circuit 4 restores data of a subblock which cannot be read out because of ongoing refresh operation, based on the data read from the other subblocks and the parity data. In FIG. 1, for example, the subblocks 1-3 to 4-3 are being refreshed while data is being read out from the subblocks 2-1 to 2-4, and thus data cannot be read out from the subblock 2-3 where the refreshing column and the reading row intersect.

Accordingly, based on data D1, D2 and D4 from the subblocks 2-1, 2-2 and 2-4 and parity data P from the subblock 2P, the data restoration circuit 4 restores data D3 of the subblock 2-3 and outputs the restored data together with the other data D1, D2 and D4.

The readout circuit 5 requests the data restoration circuit 4 to read out data, and outputs the data D1 to D4 obtained as a result of the request to outside of the semiconductor memory device.

On completing the refreshing of the subblocks 1-3 to 4-3, the refresh circuit 2 generates the next address a4 to refresh the subblocks 1-4 to 4-4 corresponding to this address. The operation explained above is sequentially performed with respect to all subblocks, and accordingly, each subblock is refreshed at a fixed cycle.

For a subblock where the refresh operation and the read operation overlap, the data restoration circuit 4 restores nonreadable data by using the parity data and other data.

Figure 2:
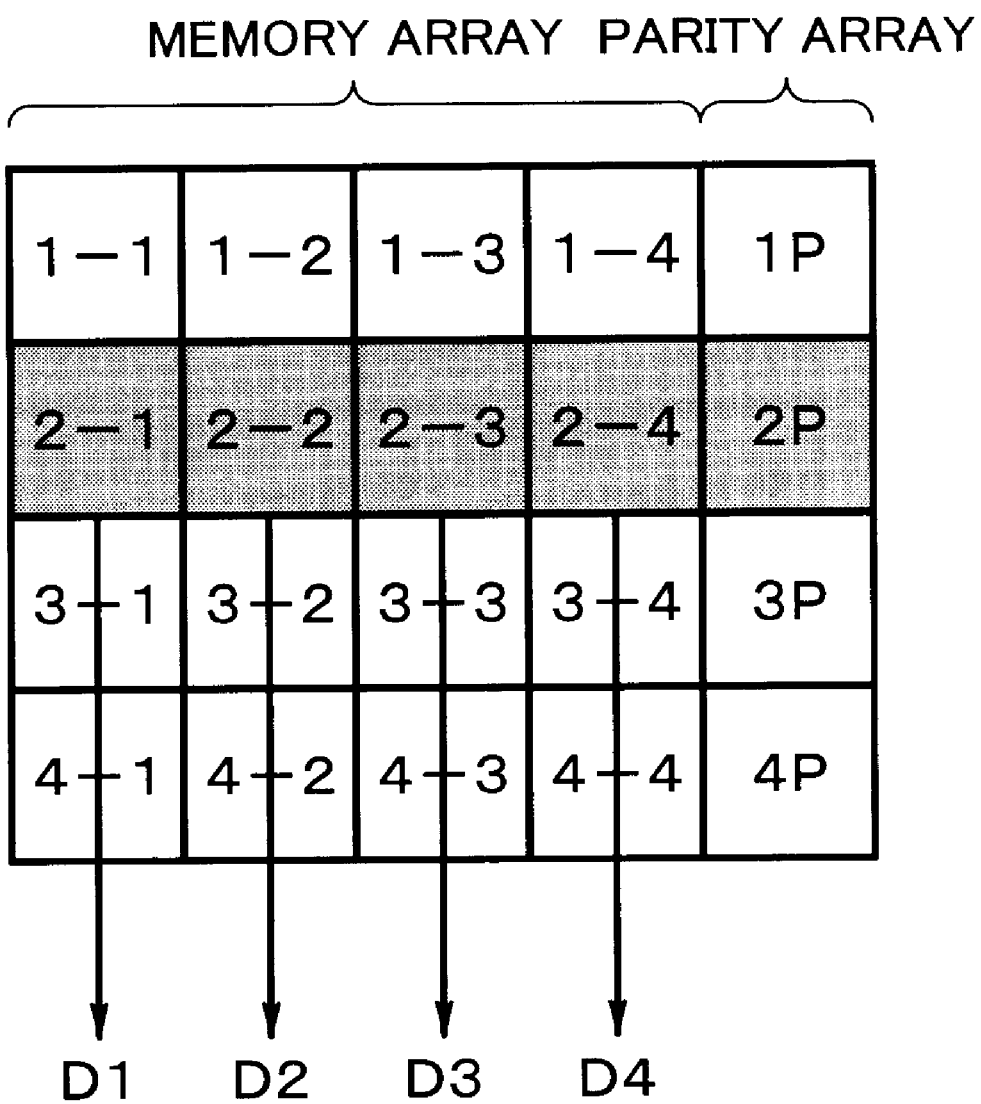
FIG. 2 is a diagram illustrating a read operation of the embodiment shown in FIG. 1.
Figure 3:
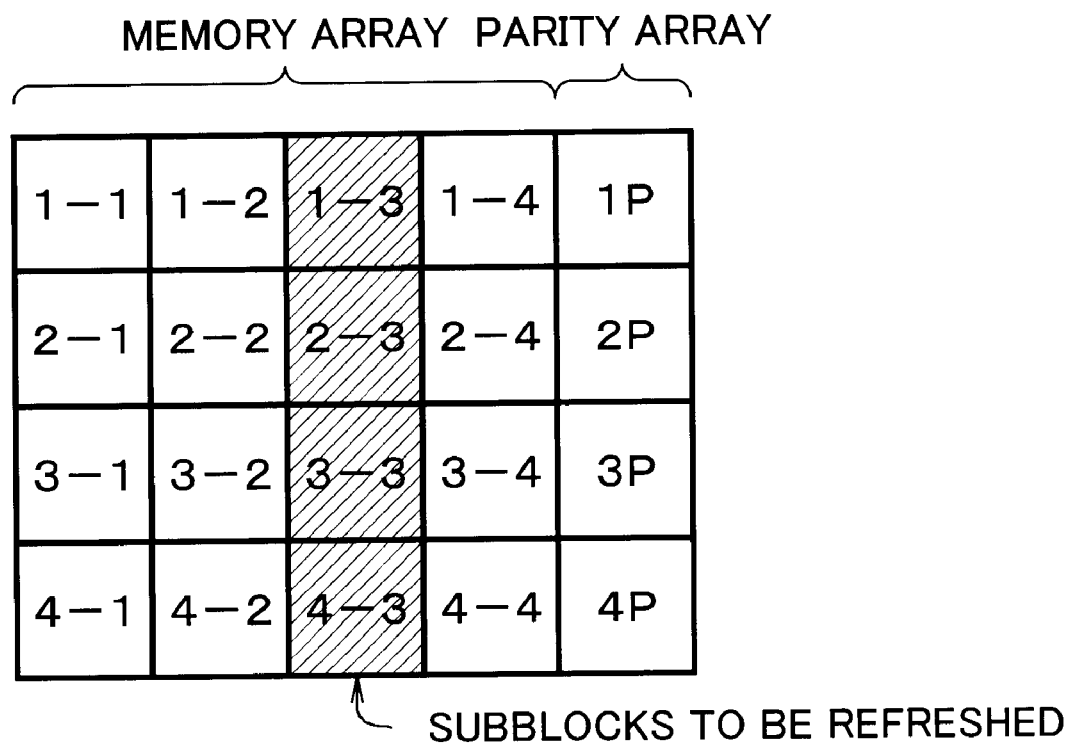
FIG. 3 is a diagram illustrating a refresh operation of the embodiment shown in FIG. 1.
Figure 4:
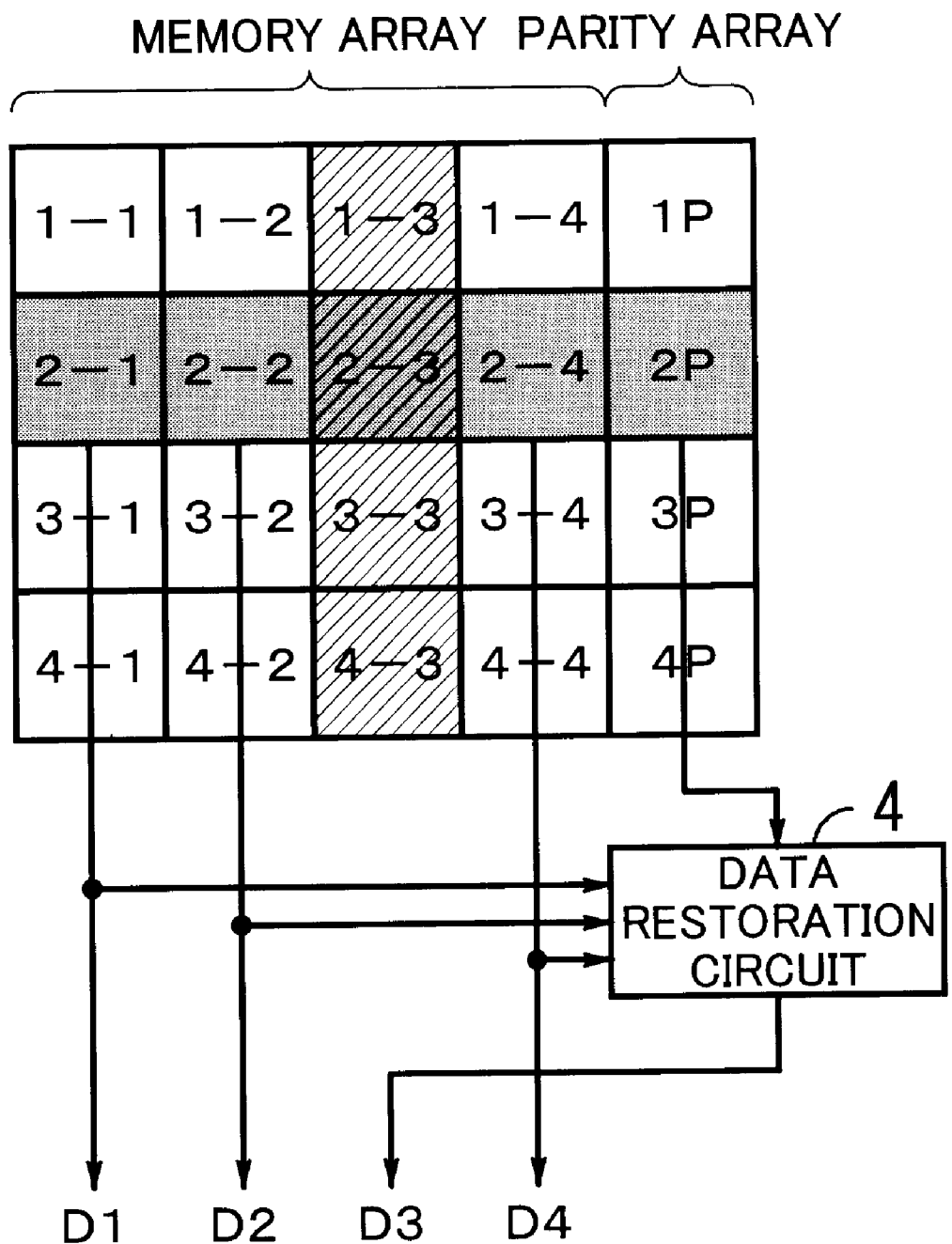
FIG. 4 is a diagram illustrating an operation wherein a target of refresh operation overlaps with a target of read operation.

Namely, in this embodiment, a row of subblocks is specified as a target of read operation, as shown in FIG. 2, and a column of subblocks is specified as a target of refresh operation, as shown in FIG. 3. For a subblock from which data cannot be read out because of refreshing, as shown in FIG. 4, the data restoration circuit 4 restores the data of the nonreadable subblock by using the data from the other subblocks and the parity data from the parity array.

As explained above, according to this embodiment, the refreshing is performed column by column, and thus, compared with the subblock-by-subblock refreshing, the number of times the refresh operation is performed can be reduced, so that the electric power consumed by the refresh operation can be cut down.

Also, in the embodiment, a target of subblocks to be refreshed intersects with a target of subblocks from which data is to be read out, and thus the number of subblocks where the refresh operation and the read operation overlap is always one, so that nonreadable data can be restored by using the parity data.

An example of the subblock arrangement 3 will be now described in detail.

Figure 5:
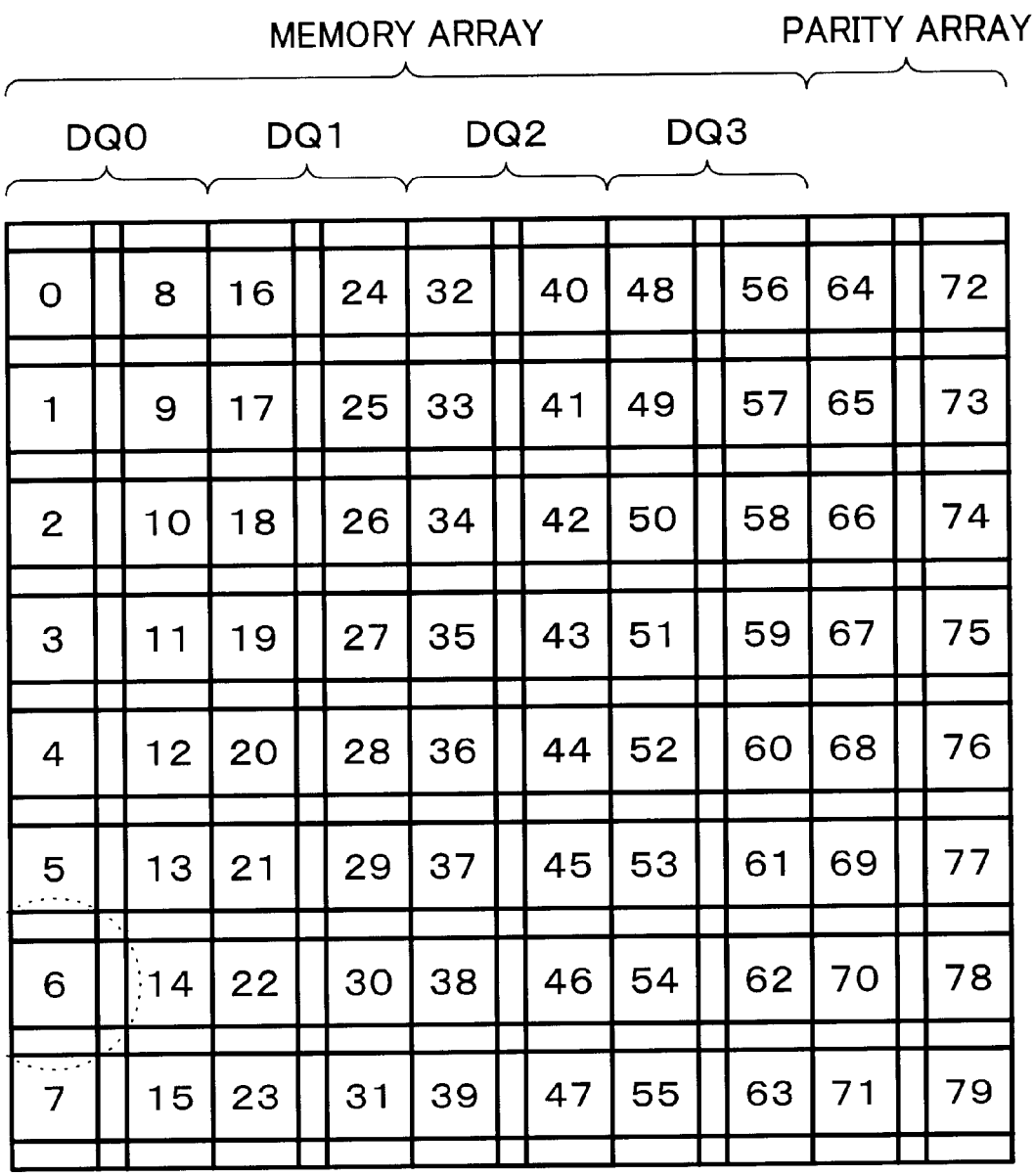
FIG. 5 is a diagram showing in detail an exemplary arrangement of subblocks wherein S/A's are a single-access type and decoders are a double-access type.

FIG. 5 shows details of the subblock arrangement 3. In the illustrated example, two subblocks are provided for one set of data, that is, two columns of subblocks are provided for each of DQ0 to DQ3. Also, one decoder is shared by two cell arrays, as described later.

Figure 6:
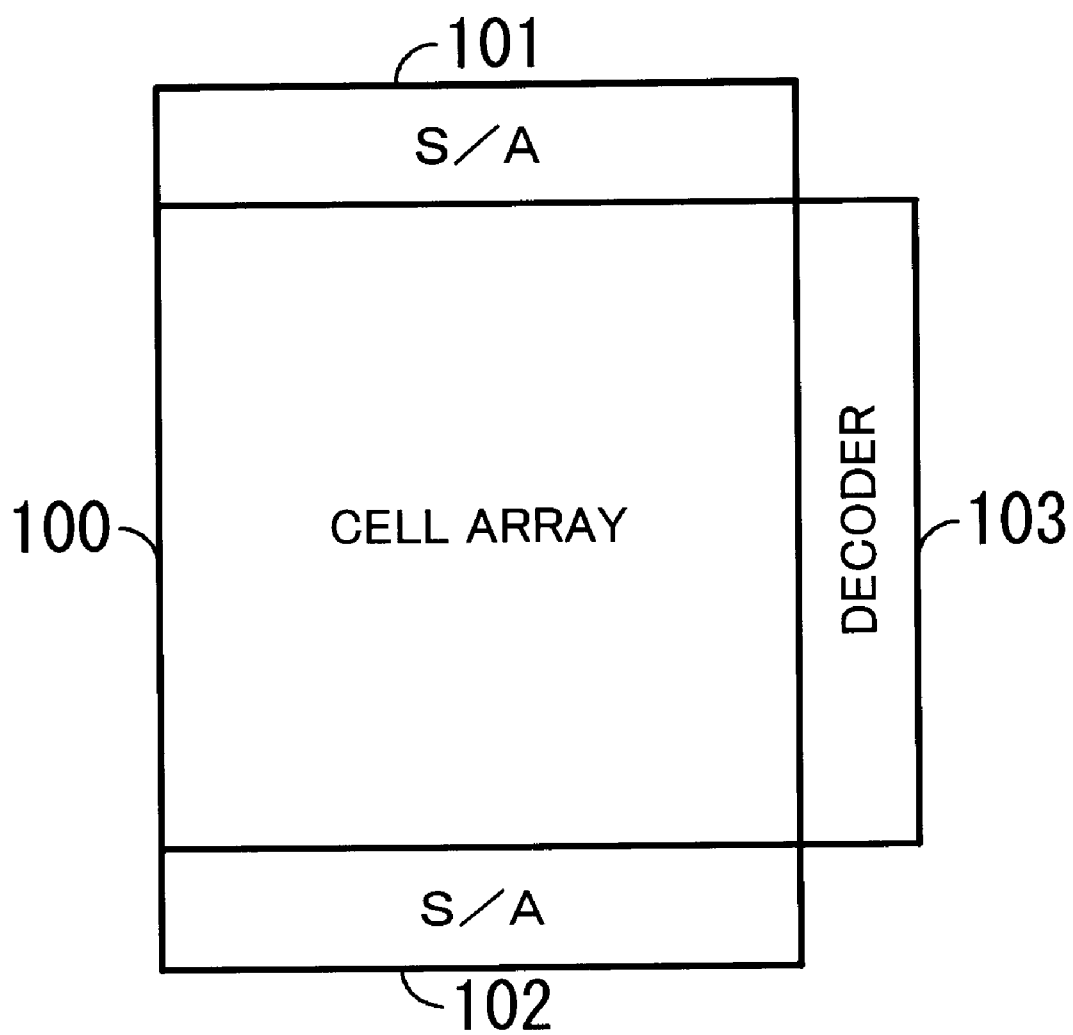
FIG. 6 is a diagram showing in detail a part of the subblock arrangement indicated by a dotted circle in FIG. 5.

FIG. 6 is an enlarged view of a part indicated by the circle in FIG. 5. As shown in the figure, one subblock is constituted by a cell array 100, S/A's 101 and 102, and a decoder 103. The cell array 100 comprises a plurality of memory cells and stores data. The S/A's 101 and 102 each amplify a signal read out from the cell array 100. The decoder 103 specifies a particular memory cell in the cell array 100 when data is to be read therefrom.

Figure 7:
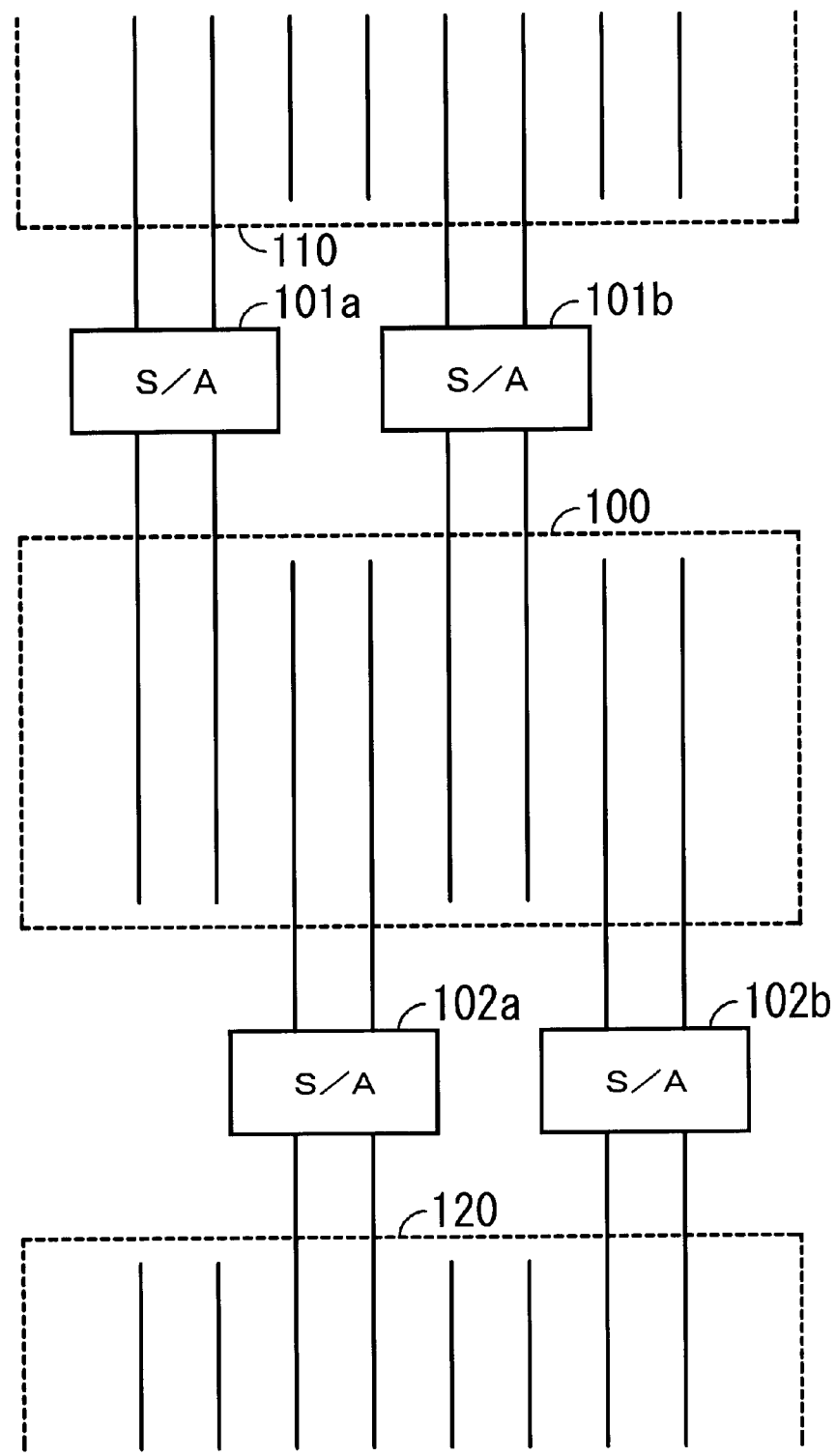
FIG. 7 is a diagram showing details of the single-access type S/A's.

As shown in FIG. 7, the S/A 101 comprises S/A's 101a and 101b, which are shared by the cell arrays 100 and 110.

Similarly, the S/A 102 comprises S/A's 102a and 102b which are shared by the cell arrays 100 and 120. In the following, this type of S/A and its associated wiring will be called "single-access type".

To read out data from either of the cell arrays 110 and 100 juxtaposed above and below, the S/A's 101a and 101b are constructed such that, in the case where the cell array 100 is a target from which data is to be read out, for example, data read from the cell array 110 is halted.

Similarly, to read out data from either of the cell arrays 100 and 120 juxtaposed above and below, the S/A's 102a and 102b are constructed such that, in the case where the cell array 100 is a target from which data is to be read out, for example, data read from the cell array 120 is halted.

Figure 8:
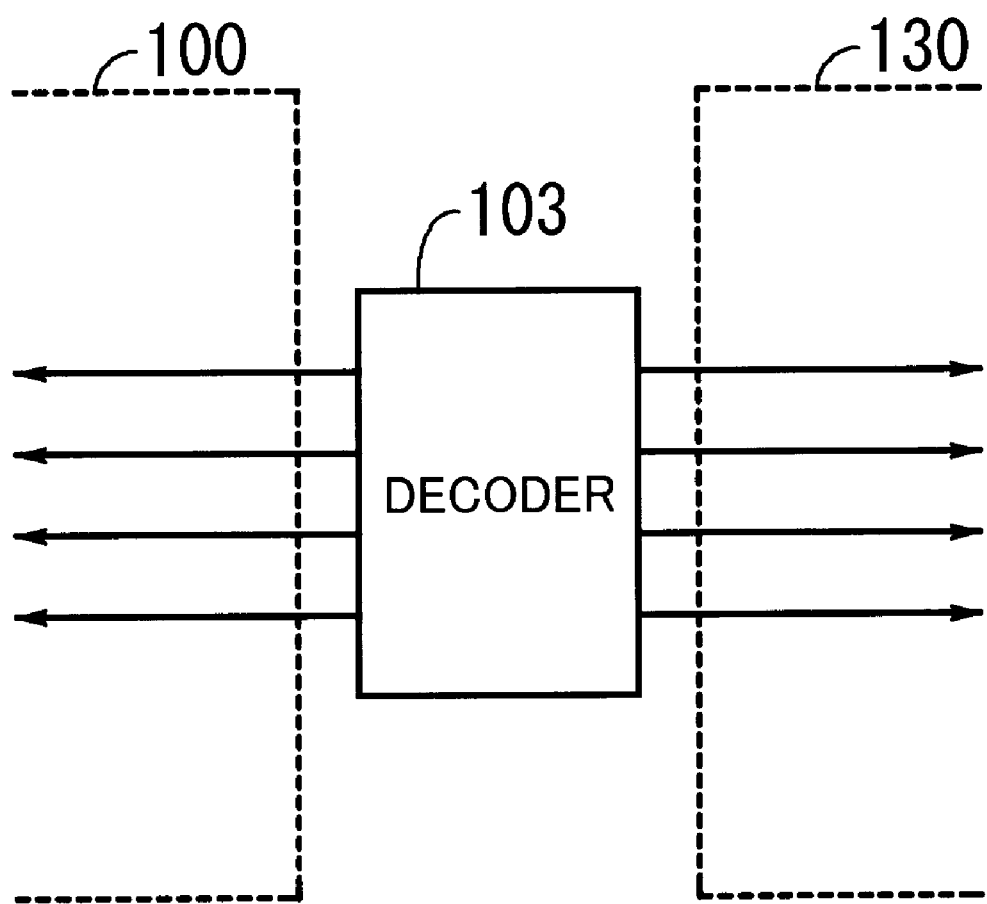
FIG. 8 is a diagram showing details of the double-access type decoder.

As shown in FIG. 8, the decoder 103 is shared by the cell arrays 100 and 130. Accordingly, when data is to be read out, both of the cell arrays 100 and 130 juxtaposed left and right are specified to read out data, and either of the read data is selected when output to the outside of the semiconductor memory device. This type of decoder and its associated wiring will be hereinafter called "double-access type".

Thus, the individual S/A's and decoders are shared by a plurality of cell arrays, and this makes it possible to reduce the area for mounting the S/A's and the decoders, and accordingly, the overall size of the semiconductor memory device.

Figure 9:
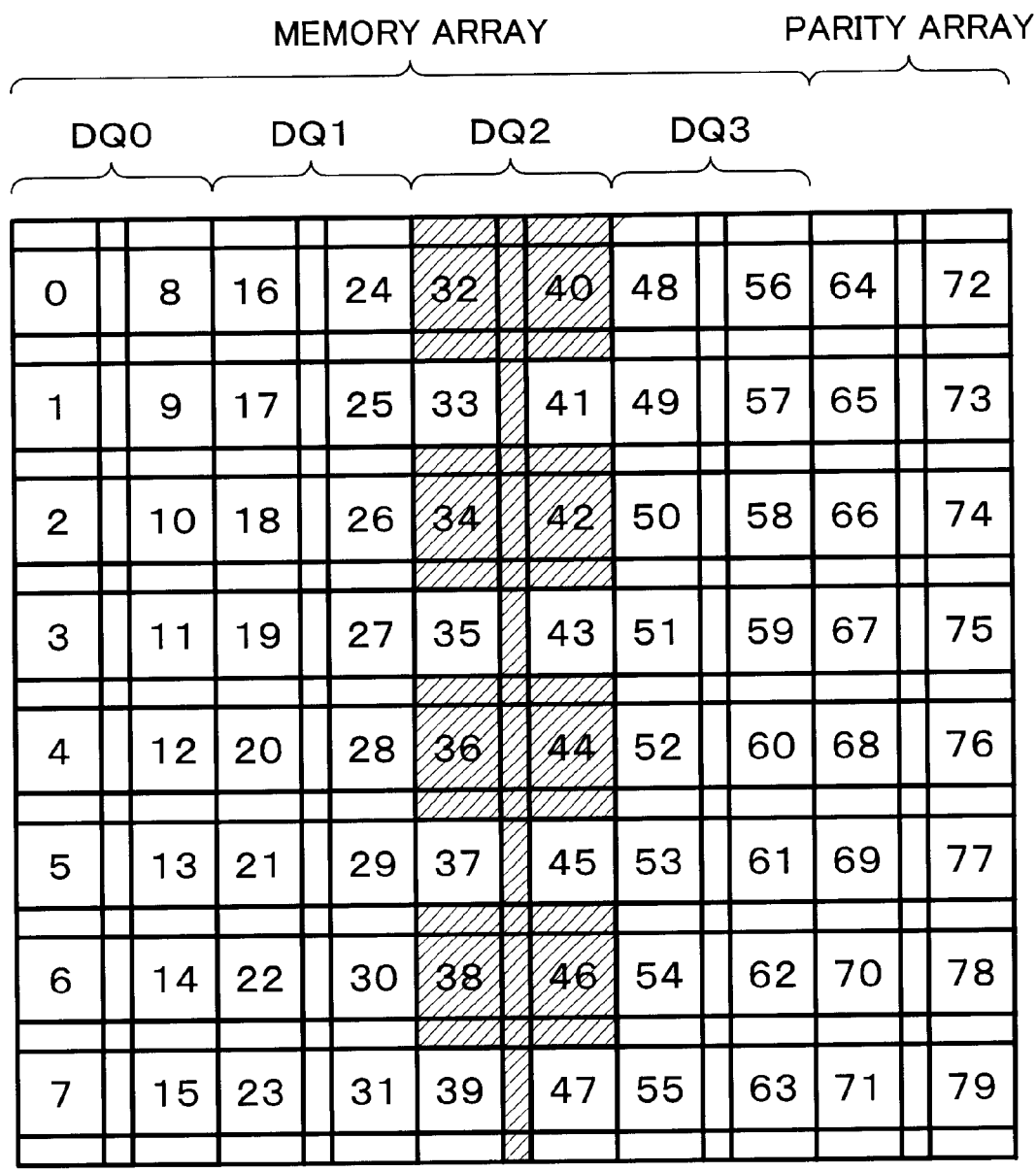
FIG. 9 is a diagram illustrating a refresh operation of the subblock arrangement shown in FIG. 5.

FIG. 9 illustrates a refresh operation wherein the S/A's are the single-access type and the decoders are the double-access type. In the illustrated example, the subblocks 32 to 47 constituting DQ2 are selected as a target of refreshing. In practice, those subblocks which are alternately positioned in the column direction are activated (the hatched blocks indicate the activated subblocks), because the single-access type S/A can select only one of the two subblocks juxtaposed above and below at a time, as mentioned above.

Figure 10:
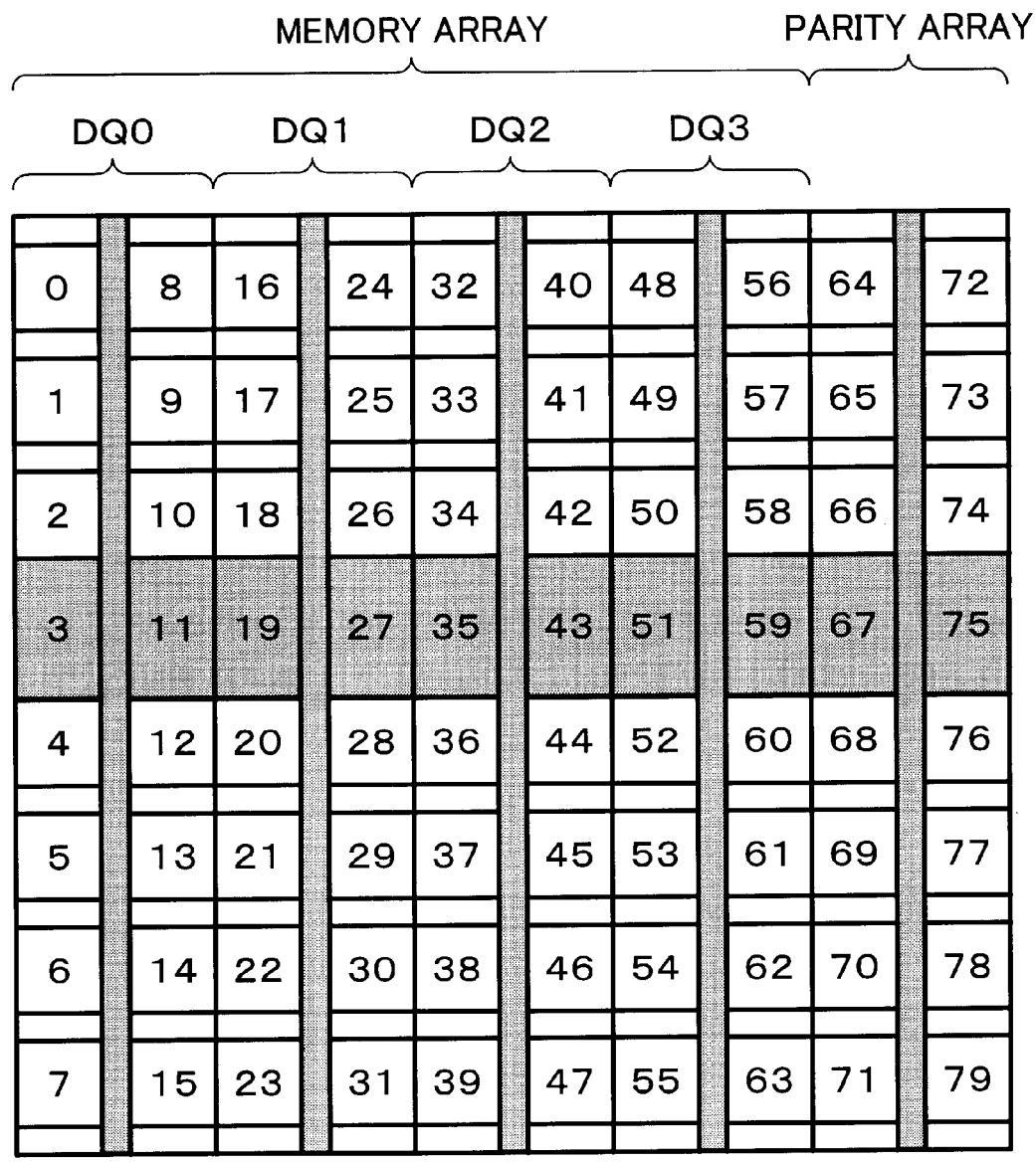
FIG. 10 is a diagram illustrating a normal access operation of the subblock arrangement shown in FIG. 5.

FIG. 10 illustrates a region activated in the case of normal access. As shown in the figure, in the case of normal access, one row of subblocks is selected and activated (the shaded blocks indicate the activated subblocks).

Figure 11:
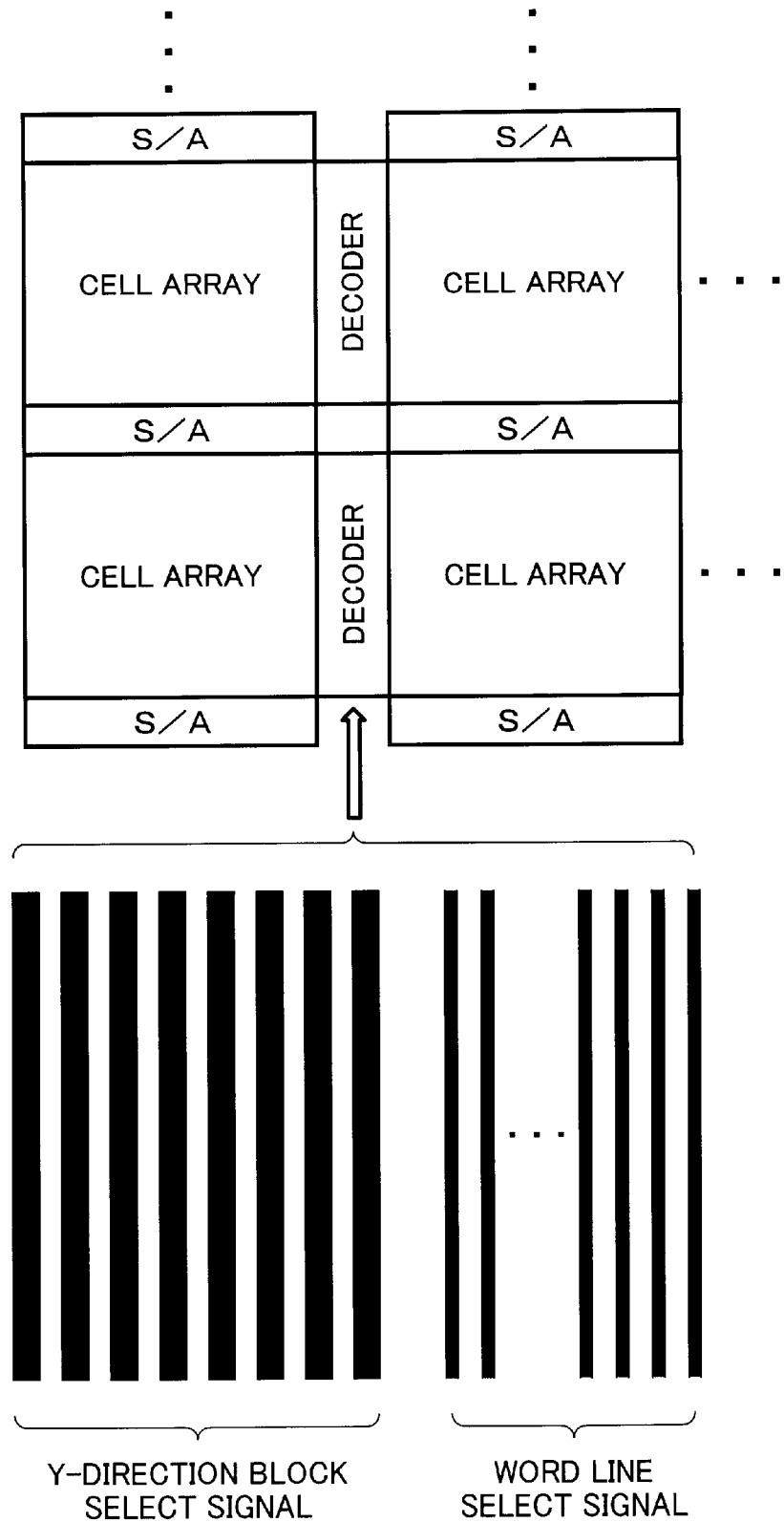
FIG. 11 is a diagram illustrating a Y-direction block select signal and a word line select signal arranged between subblocks shown in FIG. 5.

FIG. 11 illustrates a Y-direction block select signal for specifying certain subblocks in the Y direction and a word line select signal for selecting a certain word line. As shown in the figure, the Y-direction block select signal and the word line select signal are arranged on the decoders.

Figure 12:
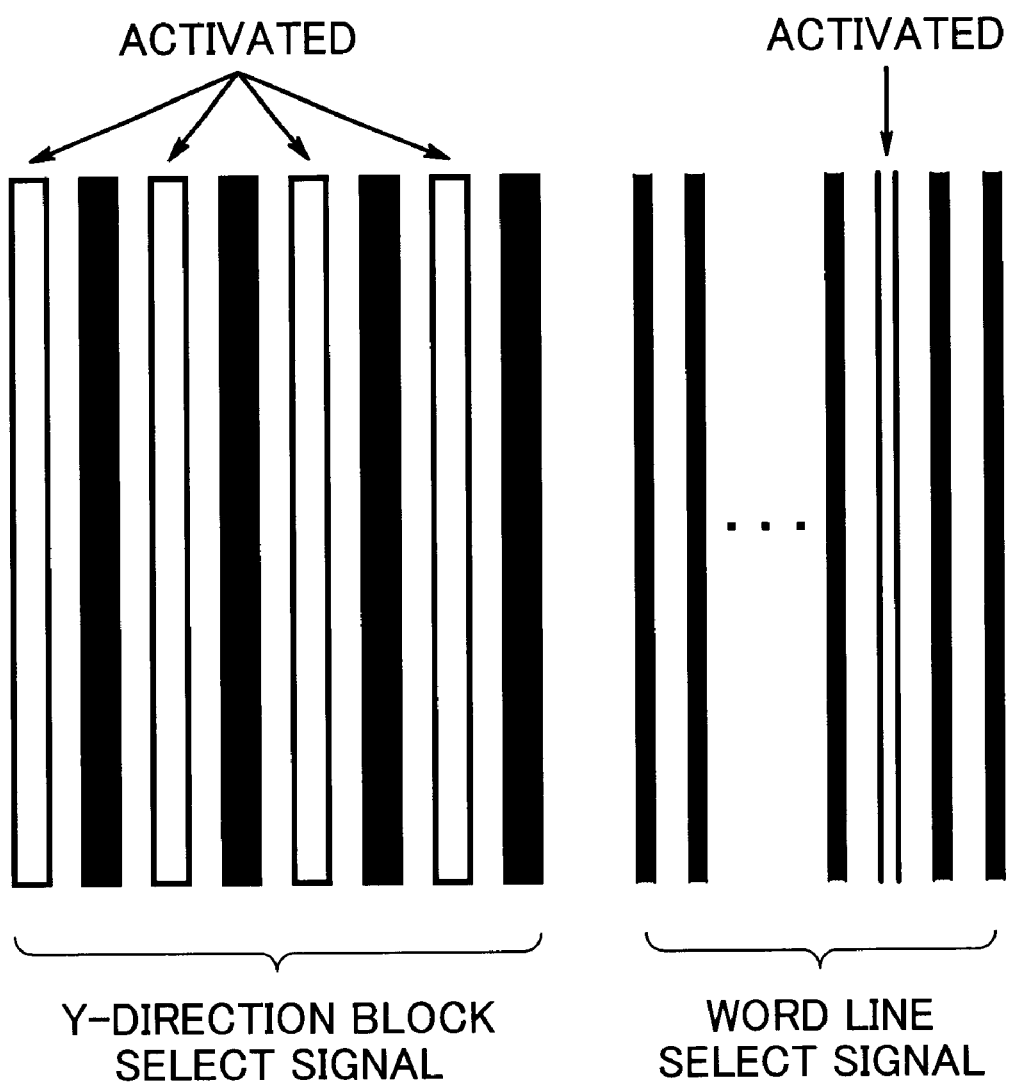
FIG. 12 is a diagram illustrating activation states of the Y-direction block select signal and the word line select signal associated with subblocks being refreshed.

FIG. 12 illustrates exemplary states of the Y-direction block select signal and the word line select signal arranged on the decoders that are associated with the subblocks being activated for refreshing. As shown in the figure, with regard to the Y-direction block select signal arranged on the decoders which are associated with the subblocks (e.g., the subblocks belonging to DQ2 shown in FIG. 9) being activated for refreshing, only those signal lines corresponding to the odd-numbered subblocks (alternate subblocks in the column direction) are activated. As for the word line select signal, only the signal line corresponding to DQ2 is activated.

Figure 13:
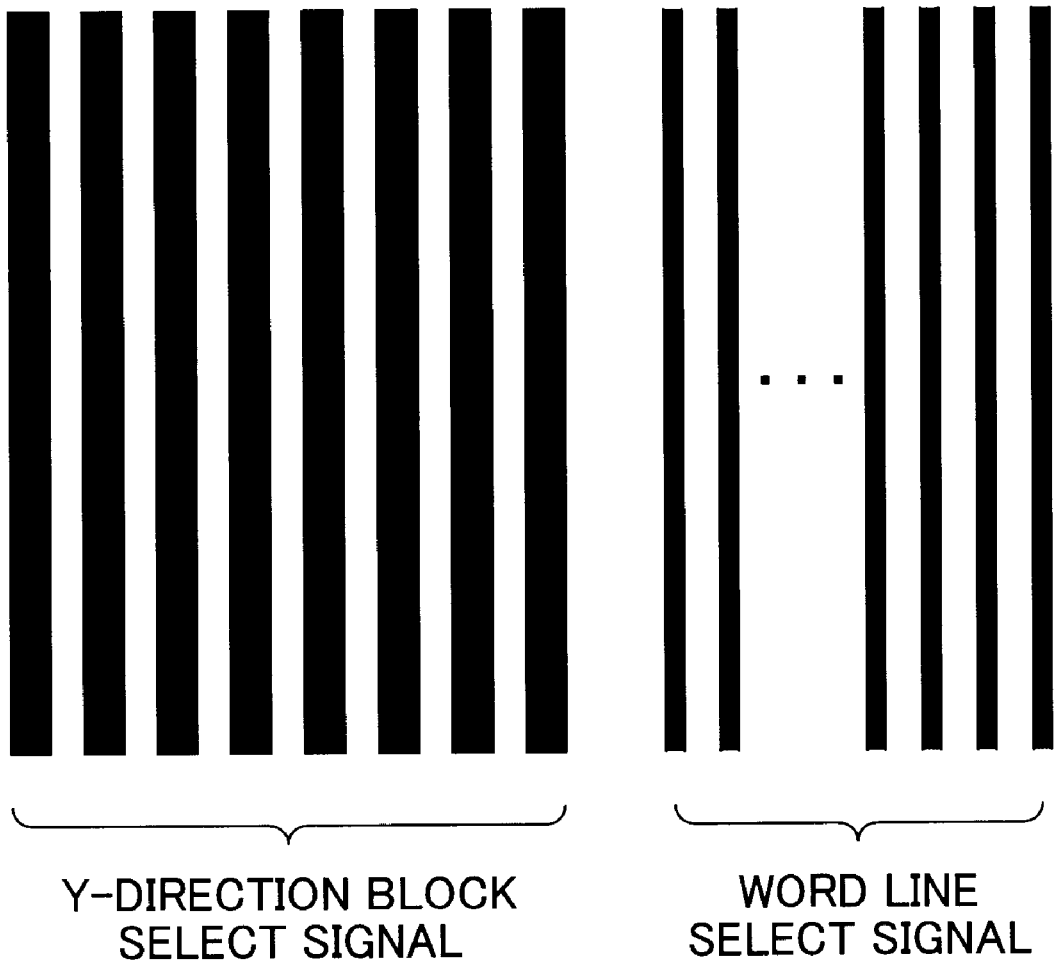
FIG. 13 is a diagram illustrating activation states of the Y-direction block select signal and the word line select signal associated with subblocks not being refreshed.

FIG. 13 illustrates exemplary states of the Y-direction block select signal and the word line select signal arranged on the decoders that are associated with the subblocks not being activated for refreshing. As shown in the figure, in the case of the Y-direction block select signal and the word line select signal arranged on the decoders which are associated with nonactivated subblocks, neither is activated at all.

Figure 14:
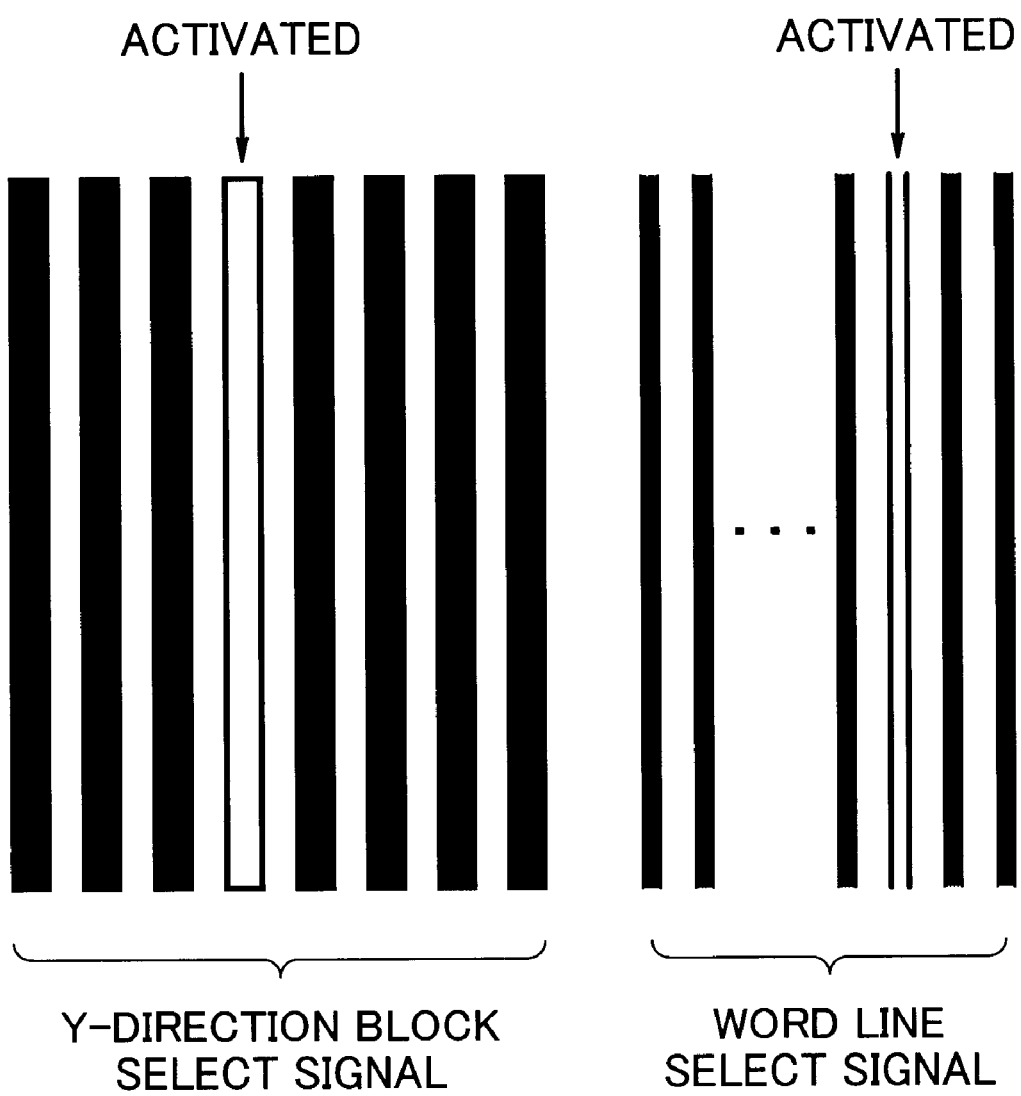
FIG. 14 is a diagram illustrating activation states of the Y-direction block select signal and the word line select signal associated with subblocks being normally accessed.

FIG. 14 illustrates exemplary states of the Y-direction block select signal and the word line select signal in the case of normal access. As shown in the figure, at the time of normal access, a Y-direction block select signal line corresponding to a column from which data is to be read out is activated, and a word line select signal line corresponding to this column is activated.

Figure 15:
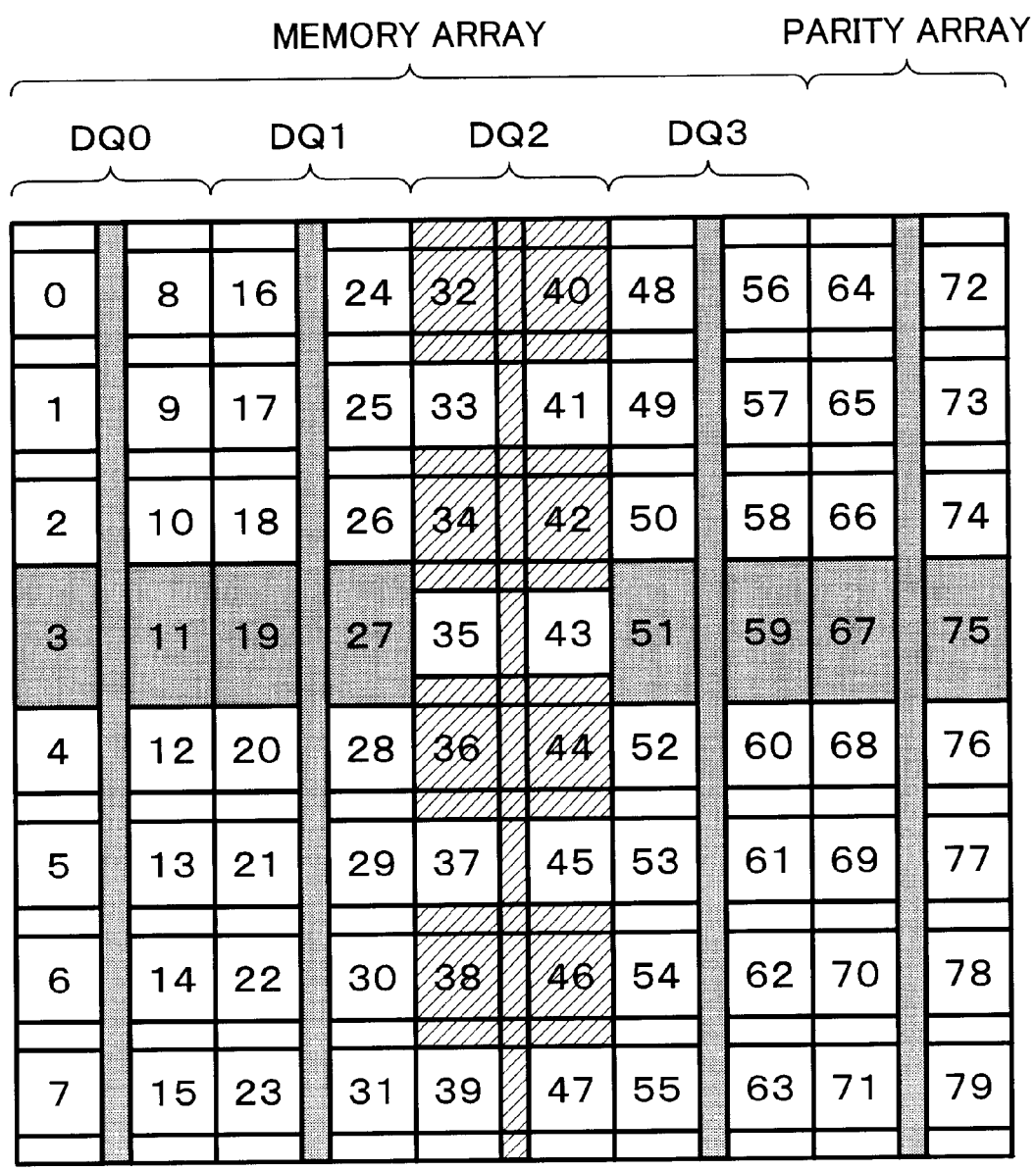
FIG. 15 is a diagram illustrating a case where refreshing and normal access are simultaneously performed with respect to the subblocks shown in FIG. 5.

FIG. 15 illustrates an example of operation wherein refreshing and normal access are simultaneously performed. In the illustrated example, the columns of subblocks belonging to DQ2 are a target of refreshing, and the fourth row of subblocks is a target of data read.

In this embodiment, the control action is performed on a decoder column-by-decoder column basis, as mentioned above, and thus, if read operation overlaps with refreshing, refreshing is carried out preferentially over read operation. Specifically, in the example shown in FIG. 15, refreshing is given precedence in respect of the subblocks 35 and 43, and as a consequence, these subblocks are excluded from the target of data read.

Accordingly, no data is obtained from the ski subblocks 35 and 43, but since the data restoration circuit 4 restores the missing data based on the parity data from the subblocks 67 and 75 belonging to the parity array and the data from the other subblocks, the operation can progress without a hitch.

In the refresh operation illustrated in FIG. 15, those subblocks which are alternately positioned in the column direction are refreshed, so that the other subblocks remain nonrefreshed. The nonrefreshed subblocks may be refreshed immediately after the first set of subblocks is refreshed, or by a refresh operation of the succeeding cycle. Specifically, in the case of DQ2, for example, the two sets of subblocks belonging to DQ2 may be refreshed separately in succession. Alternatively, one set of subblocks may be refreshed first, and after the other columns are refreshed, the other set of subblocks may be refreshed.

In the above embodiment, the decoders are the double-access type while the S/A's are the single access type. The following is a description of an embodiment in which the decoders and the S/A's are both the single-access type.

Figure 16:
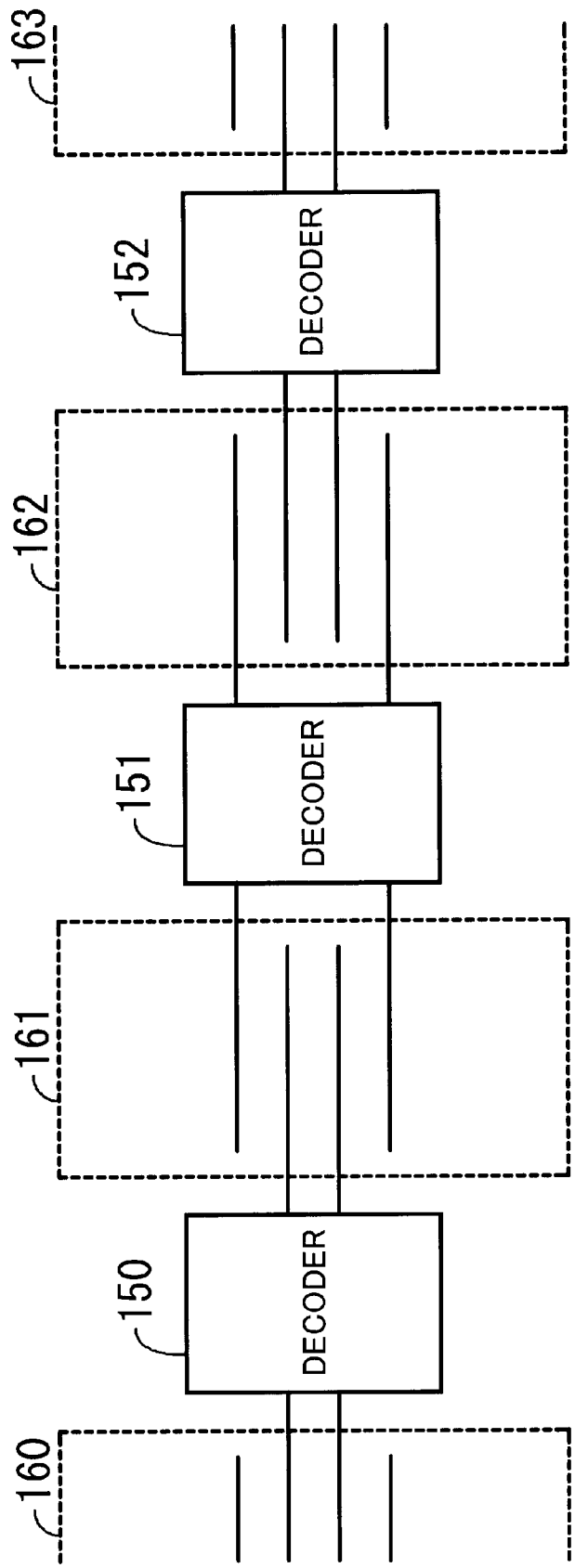
FIG. 16 is a diagram showing details of single-access type decoders.

FIG. 16 illustrates an arrangement of single-access type decoders. In the illustrated example, a decoder 150 is shared by memory arrays 160 and 161, a decoder 151 is shared by the memory arrays 161 and 162, and a decoder 152 is shared by the memory arrays 162 and 163.

Figure 18:
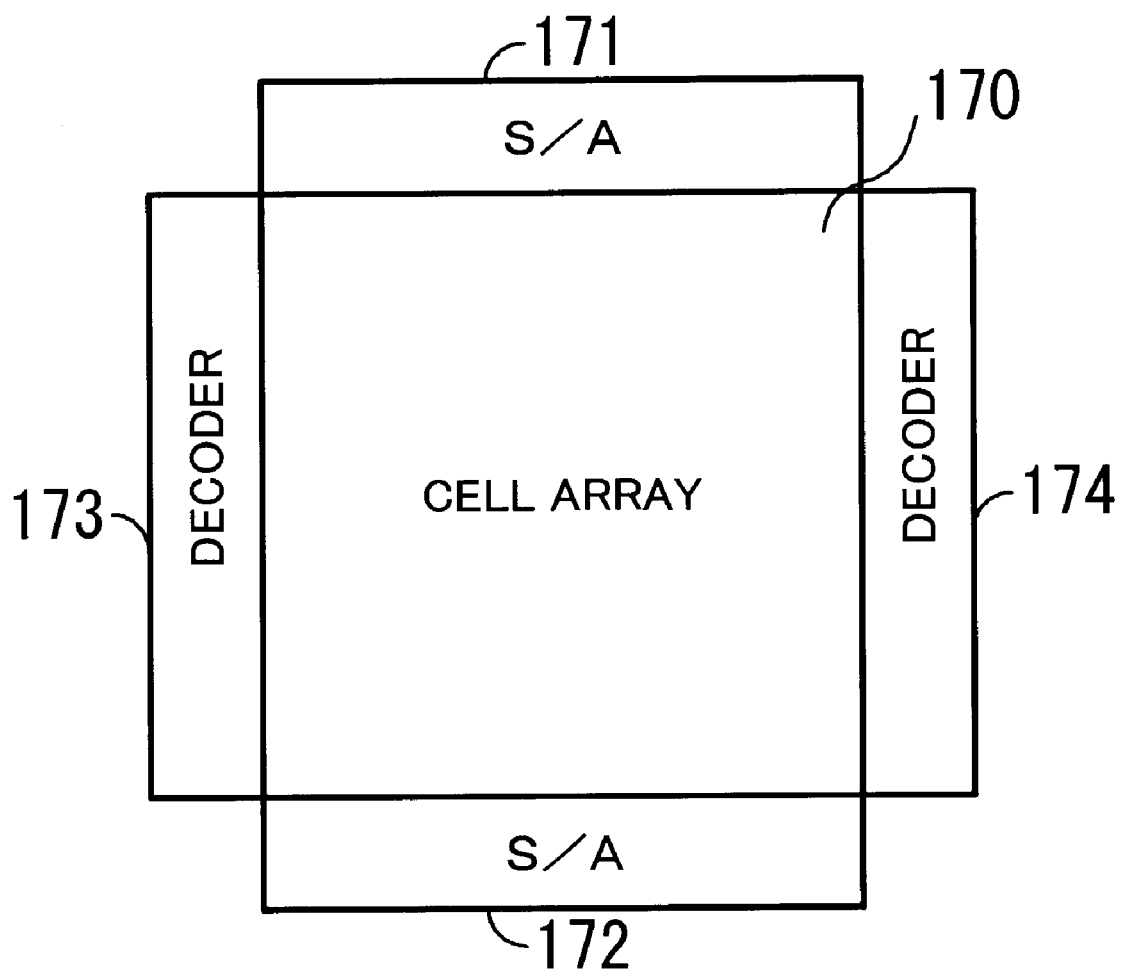
FIG. 18 is a diagram showing in detail a part of the subblock arrangement indicated by a dotted circle in FIG. 17.

FIG. 17 illustrates an exemplary arrangement of subblocks including single-access type decoders. In the illustrated example, the subblock arrangement is constituted by memory arrays DQ0 to DQ3 and a parity array. A part (subblock) indicated by the circle in FIG. 17 is constituted by a cell array 170, S/A's 171 and 172, and decoders 173 and 174, as shown in FIG. 18.

Operation of the above embodiment will be now described.

Figure 19:
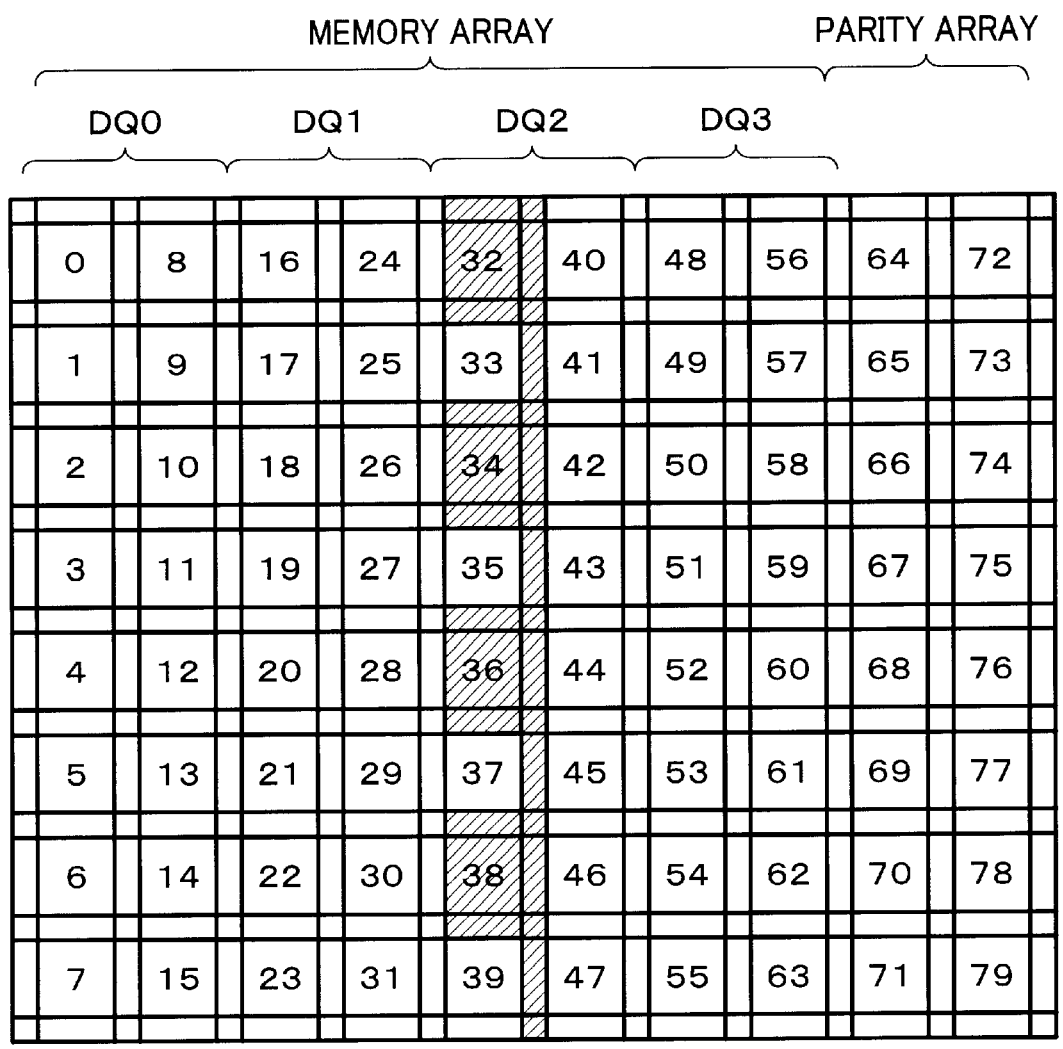
FIG. 19 is a diagram illustrating a refresh operation of the subblock arrangement shown in FIG. 17.

FIG. 19 illustrates a refresh operation. As shown in the figure, at the time of refreshing, alternate subblocks belonging to a specified column are activated (the hatched blocks indicate the activated subblocks), because the S/A is shared by the subblocks juxtaposed above and below and thus only one of the two subblocks can be activated at a time.

Figure 20:
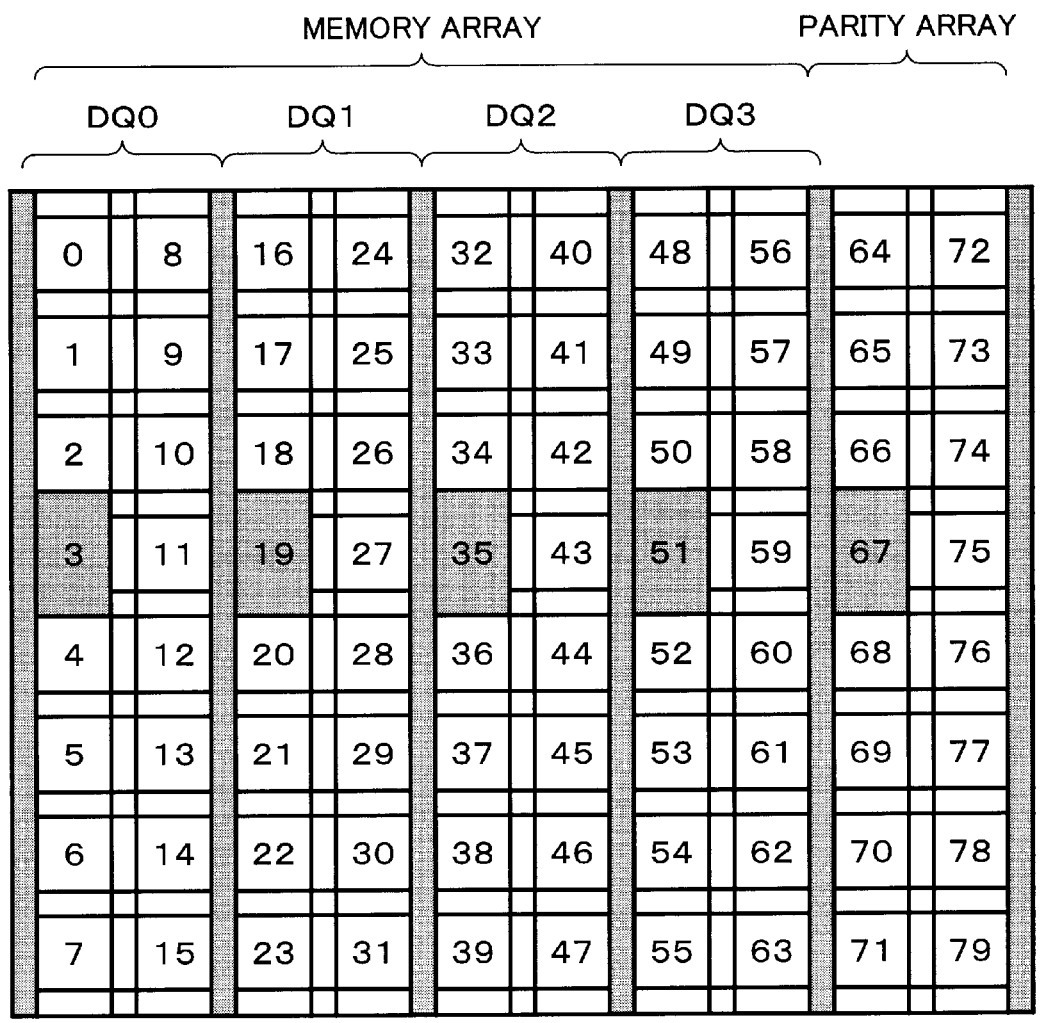
FIG. 20 is a diagram illustrating a normal access operation of the subblock arrangement shown in FIG. 17.

FIG. 20 illustrates a normal access operation. As shown in the figure, at the time of normal access, alternate subblocks belonging to a specified row are activated (the shaded blocks indicate the activated subblocks), because the decoder is shared by the subblocks juxtaposed right and left and thus only one of the two subblocks can be activated at a time.

Figure 21:
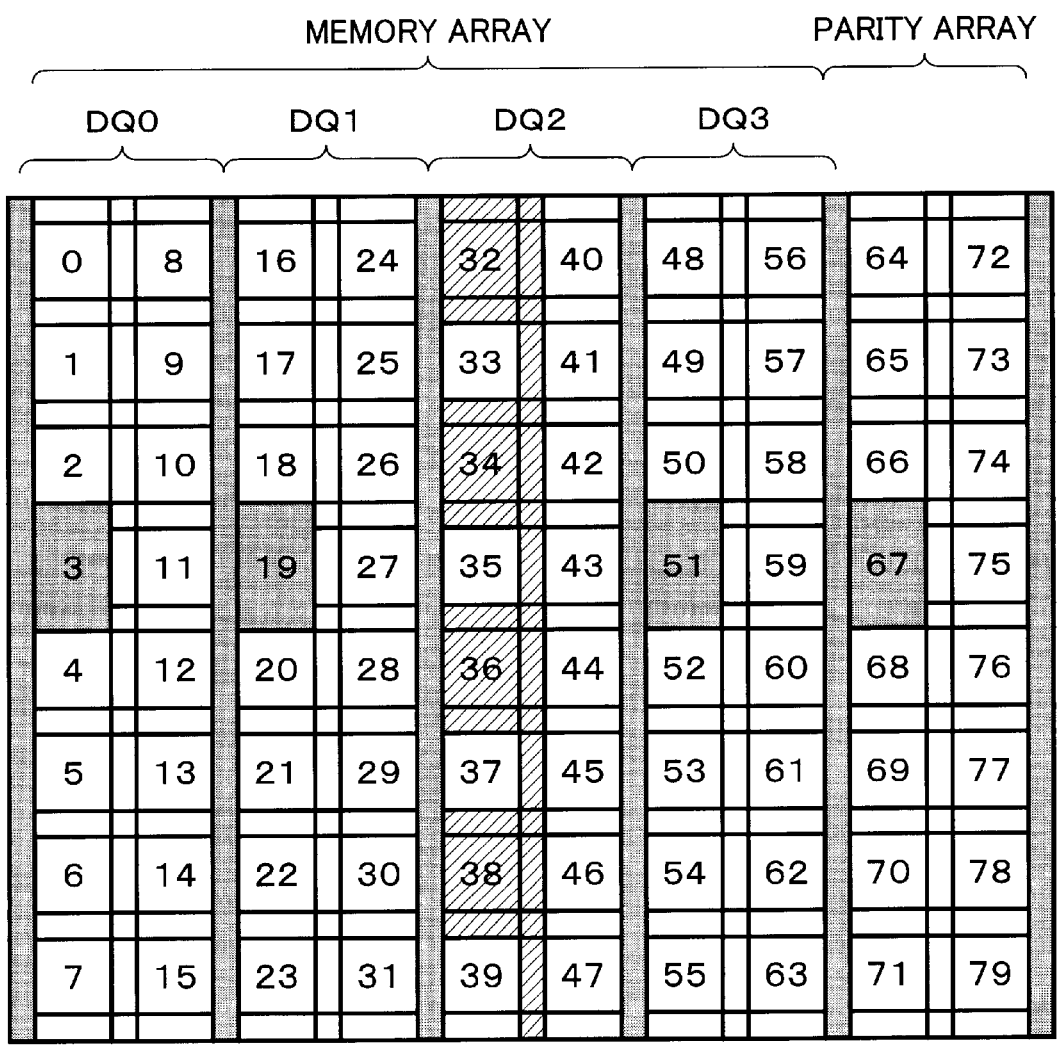
FIG. 21 is a diagram illustrating a case where refreshing and normal access are simultaneously performed with respect to the subblocks shown in FIG. 17.
Figure 23:
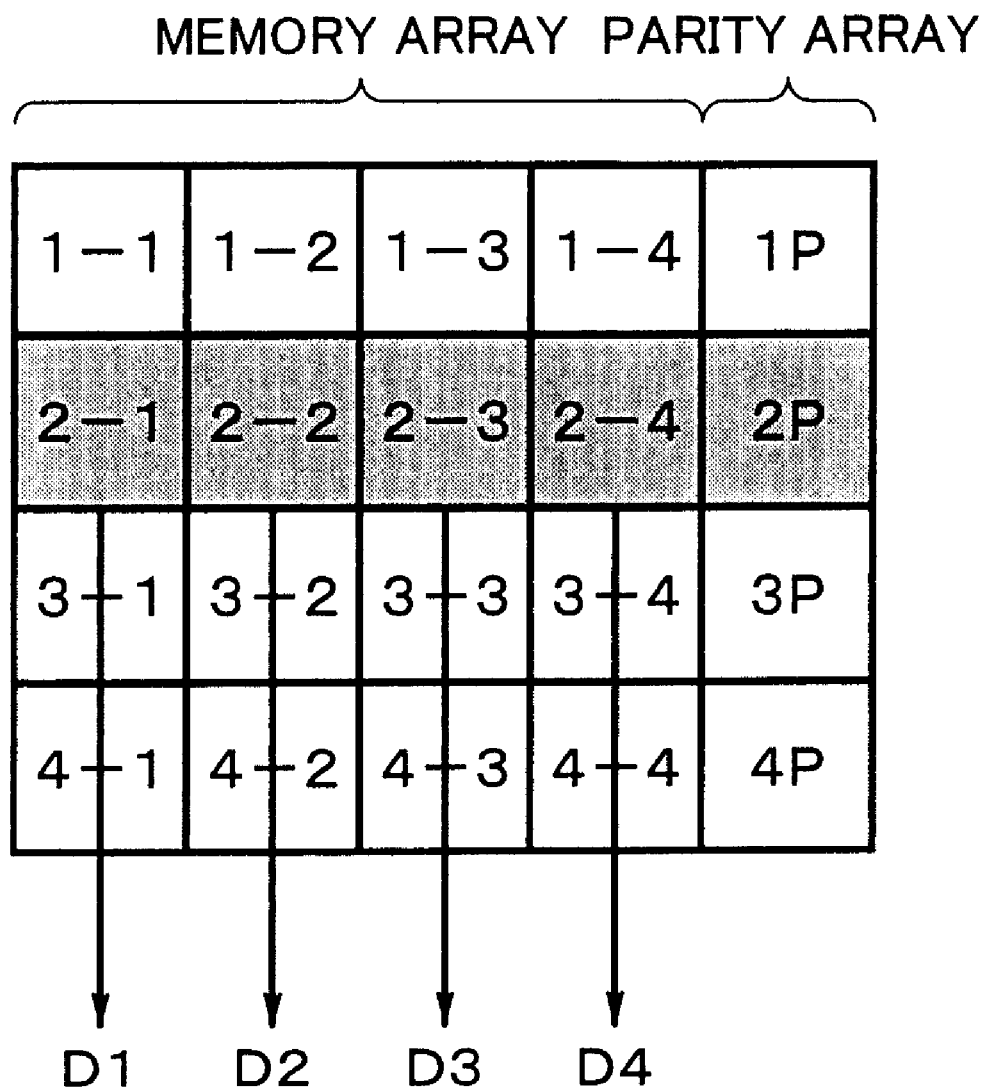
FIG. 23 is a diagram illustrating an operation of reading out data from a memory array of the semiconductor memory device shown in FIG. 22.
Figure 24:
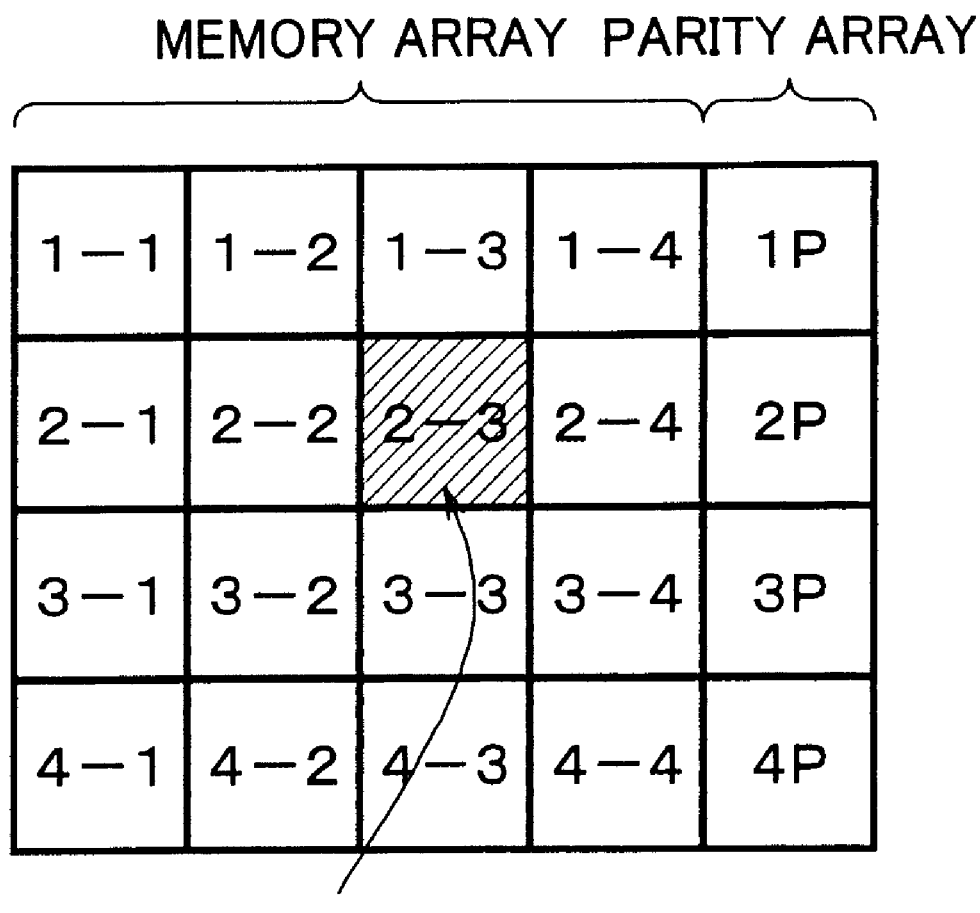
FIG. 24 is a diagram illustrating an operation of refreshing the memory array of the semiconductor memory device shown in FIG. 22.
Figure 25:
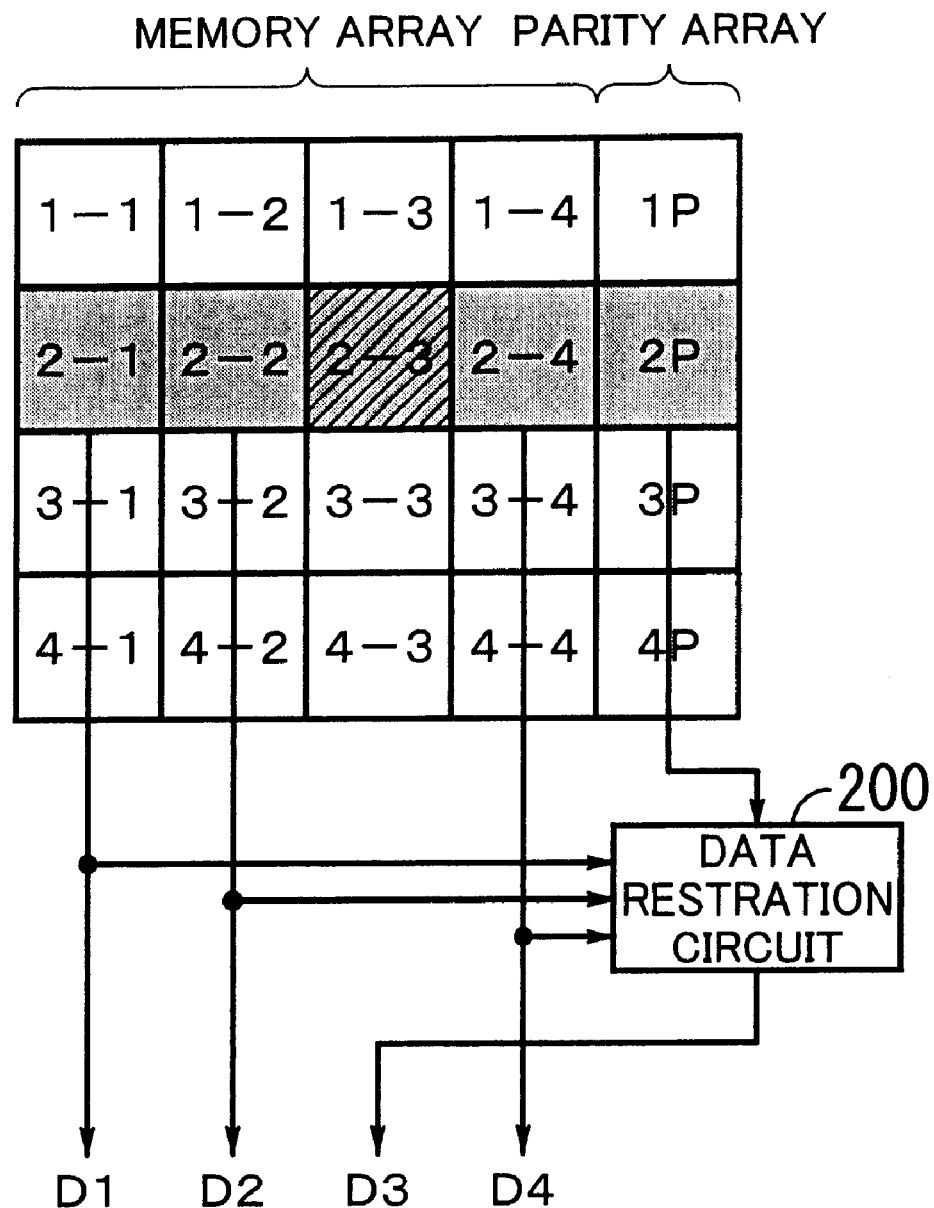
FIG. 25 is a diagram illustrating an operation wherein refreshing and normal access are simultaneously performed with respect to the memory array of the semiconductor memory device shown in FIG. 22.

FIG. 21 illustrates an operation wherein refreshing and normal access are simultaneously performed. As seen from the figure, in cases where a target of refreshing overlaps with that of normal access, refreshing is given precedence. Namely, in the illustrated example, the subblock 35 is the place where refreshing and normal access overlap, and accordingly, refreshing is performed preferentially.

Where refreshing is given precedence, data cannot be read from the subblock concerned. However, as in the aforementioned case, the data restoration circuit 4 restores the missing data by using the data from the other subblocks and the parity data, and therefore, the operation can progress without a hitch.

Thus, the present invention is also applicable to the arrangement wherein the decoders and the S/A's are both the single-access type.

As described above, in the semiconductor memory device of the present invention, a target of refreshing and a target of normal access are selected so as to intersect with each other, and refreshing and normal access are performed simultaneously. For a subblock from which data cannot be read out, data from the parity array is used to restore the missing data, whereby power consumption by the refresh operation can be reduced, compared with the conventional circuit.

In the above embodiments, a subblock constituted by a plurality of memory cells is selected as a unit of refreshing or normal access. Alternatively, a single memory cell may be selected as such unit to perform operation similar to the above.

Also, in the aforementioned examples of subblock arrangement, the S/A's and the decoders are each shared by subblocks. Needless to say, the present invention can be applied to a subblock arrangement in which neither S/A's nor decoders are shared by subblocks.

Further, in the above embodiments, the subblocks belonging to a specified column are collectively refreshed. The subblocks may alternatively be divided into a plurality of groups to be refreshed separately.

As described above, according to the present invention, a semiconductor memory device in which subblocks each constituted by one or two or more memory cells are arranged in matrix form comprises an address input circuit for receiving an input address, a readout circuit for reading out data from at least part of a subblock group arranged in a column or row direction and specified by the address input via the address input circuit, and a refresh circuit for refreshing at least part of a subblock group arranged in a row or column direction and intersecting with the subblock group from which data is read out by the readout circuit, whereby power consumption by the refresh operation can be reduced.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor memory device in which subblocks each constituted by one or two or more memory cells are arranged in matrix form, comprising:

an address input circuit for receiving an input address;

a readout circuit for reading out data from at least part of a subblock group arranged in a column or row direction and specified by the address input via said address input circuit; and a refresh circuit for refreshing at least part of a subblock group arranged in a row or column direction and intersecting with the subblock group from which data is read out by said readout circuit;

wherein the subblock group from which data is read out by said readout circuit includes a subblock storing parity data for restoring data, and said semiconductor memory device further comprises a data restoration circuit for restoring data of a subblock where the subblock group from which data is read out by said readout circuit intersects with the subblock group which is refreshed by said refresh circuit, based on the parity data and data of other subblocks.

2. The semiconductor memory device according to claim 1, further comprising an address generator circuit for generating an address for specifying a subblock group which is to be refreshed by said refresh circuit.

3. The semiconductor memory device according to claim 2, wherein said address generator circuit generates an address which is independent of the address input via said address input circuit.

4. The semiconductor memory device according to claim 2, wherein said address generator circuit generates an address specifying a part of the subblock group to be refreshed and is able to control individual parts of the subblock group independently of each other.

5. The semiconductor memory device according to claim 2, wherein said address generator circuit generates an address which specifies, as the subblock group to be refreshed, any of subblock groups arranged in a DQ direction.

6. The semiconductor memory device according to claim 1, wherein each of the subblocks includes an S/A (Sense Amplifier) and a decoder, and the S/A or the decoder is shared by a plurality of subblocks.

7. The semiconductor memory device according to claim 4, wherein said readout circuit reads out data from those parts of the subblock group which are alternately positioned in the column or row direction.

8. The semiconductor memory device according to claims 4, wherein said refresh circuit refreshes those parts of the subblock group which are alternately positioned in the row or column direction.

* * * * *